(12) United States Patent
Schmidt

(10) Patent No.: US 7,135,916 B2
(45) Date of Patent: Nov. 14, 2006

(54) DIGITALLY ADJUSTABLE AMPLIFIER FOR INTEGRATED CIRCUIT

(76) Inventor: Albrecht Schmidt, Zionskirchstrasse 28, D-10119 Berlin (DE)

(*) Notice: Subject to any disclaimer, the term of this patent is extended or adjusted under 35 U.S.C. 154(b) by 0 days.

(21) Appl. No.: 10/636,408

(22) Filed: Aug. 7, 2003

(65) Prior Publication Data

US 2004/0027195 A1 Feb. 12, 2004

(30) Foreign Application Priority Data

Aug. 7, 2002 (DE) ................ 102 36 861

(51) Int. Cl.
*G01R 19/00* (2006.01)
(52) U.S. Cl. .............................. 330/2; 330/9
(58) Field of Classification Search ............ None
See application file for complete search history.

(56) References Cited

U.S. PATENT DOCUMENTS

| 6,242,974 B1 | 6/2001 | Kunst .................. 330/9 |
| 6,252,454 B1* | 6/2001 | Thompson et al. ........... 330/2 |
| 6,262,625 B1* | 7/2001 | Perner et al. ............. 330/2 |
| 6,642,784 B1* | 11/2003 | McMorrow ................ 330/2 |

OTHER PUBLICATIONS

Massimo Lanzoni et al.: Automatic and Continuous Offset Compensation of MOS Operational Amplifiers Using Floating-Gate Transistors; IEEE Journal of Solid-State Circuit, vol. 33, No. 2, Feb. 1998.
Hendrik van der Ploeg et al.: A 2.5-V 12-b 54 Msample/s 0.25-m CMOS ADC in 1-mm2 With Mixed-Signal Chopping and Calibration; IEEE Journal of Solid-State Circuits, vol. 36, No. 12, Dec. 2001.
R. Razavi: "Precision Techniques" Chapter 8, pp. 198-231 from "Principles of Data Conversion System Design"; IEEE Press, 1995.

* cited by examiner

Primary Examiner—Khanh Van Nguyen
(74) Attorney, Agent, or Firm—Karl Hormann

(57) ABSTRACT

A digitally adjustable amplifier with adjustable input offset voltage and amplification parameters for use in integrated circuits. Such adjustments are carried out by a binary counter which controls a non-binary weighting element which by a non-binary weighting of each stage to the next stage intentionally has a non-linearity of the ideal characteristic curve because of greater negative steps at increasing value count so that the steps remain below one least significant bit. Thus greater errors even can be tolerated, and a desired value can be very closely attained.

11 Claims, 2 Drawing Sheets

DIGITALLY ADJUSTABLE AMPLIFIER FOR INTEGRATED CIRCUIT

BACKGROUND OF THE INVENTION.

1. Field of the Invention

The invention, in general, relates to an amplifier and, more particularly, to an amplifier for use in integrated circuits and for digitally balancing the input offset voltage and amplification parameters with high precision at low technological complexity and on a small chip surface. Such amplifiers make possible precise digital adjustments of parameters, such as, for instance, amplifiers with zero-point correction. As well as to voltage amplifiers such as operational amplifiers for instance, the invention relates to amplifiers whose output parameter is a current, as, for instance, in operational transconductance amplifiers. In the case of the latter, transconductance will be the amplification to be adjusted.

2. The State of the Art

In the fabrication of integrated amplifiers, the balancing of parameters constitutes a significant problem. Balancing may take place during manufacture, for instance by the trimming of resistors with a laser, or by self-adjustment, using a built-in additional compensation circuit. As a rule, the latter provides a more economical solution in which the self-adjusting amplifier includes a compensating analog amplifier which, in addition to the conventional inputs for the signal to be amplified, is provided with a further analog input for compensating an adjustable parameter. Furthermore, the self-adjusting amplifier includes a compensation circuit for providing an adjustment value for the additional analog input. The adjustment value is determined during a compensation phase and is stored for the operational phase of the amplifier. Frequently, the purpose of the adjustment is to minimize the input offset voltage of the amplifier. This can be accomplished in various ways. In this regard, an overview is offered by R. Razavi in "Principles of Data Conversion System Design", IEEE Press, 1995, chapter 8, "Precision Techniques", pp. 198–231. As disclosed, for instance, by U.S. Pat. No. 6,242,974, the approaches chiefly involve volatile storage of the compensation value, usually as a charge of an integrated capacitance, for instance in conventional auto-zero amplifiers. Their advantage resides in small required chip surfaces; but their disadvantage is that, because of the small time constant of the discharge of the integrated capacitance, the adjustment must be repeated at short intervals, for instance at repetition rates in the kilohertz range. This generates an interference signal determined by the adjustment repetition rate. Hence, such amplifiers have a very restricted range of applications.

As regards applications or uses, a more advantageous solution is offered by non-volatile storage systems of a one-time adjustment, e.g. while energizing, of production-based errors without any subsequent interruptions of the operational phase. In the case of adjustments of greater precision, the adjustments may advantageously be repeated at longer intervals, for instance, every ten seconds, in order to compensate for changed parameters. Volatile storage in an integrated capacitance cannot provide such long operational phases. Known solutions involving non-volatile storage either require additional technological steps and a relatively long compensation phase by storing the compensation value in a "floating gate" (vide, for instance, M. Lanzoni, G. Tondi, P. Galbiati, and B. Ricco in "Automatic and Continuous Offset Compensation of MOS Operational Amplifiers Using Floating-Gate Transistors", IEEE J. Solid-State Circuits, Vol. 33, pp. 287–290, February 19988), or they store a digitized adjustment value and use a digital-to-analog-converter to generate the necessary analog adjustment value (see, for instance, H. van der Plueg, G. Hoogzaad, H. A. H. Termeer, M. Vertregt, and R. I. J. Roovers in "A 2.5-V 12-b 54 M sample/s 0.25 µm CMOS ADC in 1-mm$^2$ With Mixed-Signal Chopping and Calibration". IEEE J. Solid-State Circuits, Vol. 36, pp. 1959–18677, December 2001).

Having regard to this latter approach in respect of which FIG. 1 depicts an exemplary digitally adjustable amplifier 100, the digital-to-analog-converter 130 must be of the requisite precision to be able to generate a sufficiently accurate value for adjusting the adjustable analog amplifier 110. The value may be controlled, for instance, in a digital control loop which includes a microprocessor 120 and a comparator 140. A control input 105 presets the instance of the adjustment. A handshake output 101 issues a signal indicative of the termination of the compensation phase. During the compensation phase, an input switch 150 switches the analog amplifier 110 such that the comparator 140 contains data relating to the adjustable parameter which is evaluated in the digital control loop for setting the analog amplifier 110. Elevated levels of precision in respect of the adjustment would require a complex digital-to-analog-converter provided, for this purpose, with self-adjusting elements and circuits. Such an arrangement would necessitate a much larger chip surface than the chip surface of the analog amplifier 110 itself and result in a considerable cost increase.

Thus, due to errors resulting from frequently repeated adjustments, the known solutions for adjusting parameters of integrated amplifiers either significantly restrict the range of application of such amplifiers, or they necessitate technological complexity or chip sizes which make the amplifier much more expensive. For that reason, most integrated amplifiers are manufactured without compensation circuits and suffer from significant errors, particularly in respect of the input offset voltage. In order to keep these errors within limits, further processes are necessary, such as assembling the input transistors in a symmetrical arrangement from a plurality of individual transistors. This requires chip surfaces of increased size and changes the behavior of the amplifiers, for instance, by increasing their input capacitance. Moreover, requirements of high precision can only seldom be satisfied.

OBJECTS OF THE INVENTION

It is an object of the invention to overcome the disadvantages of prior art amplifiers.

A further object of the invention is to provide an integrated amplifier which can be realized economically on a small surface and which is digitally adjustable with great precision.

Another object of the invention is to provide an amplifier in which the input offset voltage and amplification can be precisely adjusted for automatic zero adjustment.

Yet a further object of the invention is partly or completely to avoid prior solutions of low manufacturing tolerances by making possible adjustments in an economic manner.

A still further object is to provide an amplifier which partially or completely avoids the disadvantages of large input capacitance as results from the size of the transistors.

BRIEF SUMMARY OF THE INVENTION

In accordance with a first preferred embodiment of the invention these objects are accomplished by a digitally adjustable amplifier having adjustable input offset voltage or amplification parameters for use in integrated circuits and provided with an adjustable analog amplifier provided with an input for adjusting the input offset voltage or amplification of the adjustable analog amplifier and, further, with a block of B binary inputs and an analog output, the output being connected to the adjustment input of the adjustable analog amplifier, as well as with a counter with B binary outputs connected to the binary inputs of the block, a weighting factor being associated with each value i of binary outputs from 1 to B of that value and each weighting factor having a relative error, each relative error having associated therewith an upper threshold $e_{imax}$ and each value of the upper threshold $e_{imax}$ having associated therewith a weighting factor defined by $k_1 = 2/(1+e_{imax})$.

Such amplifiers can be adjusted with great precision and require small chip surfaces and may be used, for instance, in self-adjusting amplifiers.

The amplifier in accordance with the invention may be adjusted with great precision, and in addition to an amplifier whose input offset voltage or amplification parameter such as voltage amplification or transconductance may be adjusted by way of an analog input it includes a non-binary weighting element (NBWE) whose output is connected to the analog control input of the adjustable analog amplifier and a binary counter whose binary outputs are connected to the NBWE. The NBWE is designed such that the effect of any given binary output I of the counter on the output of the NBWE is larger by a nominal weighting factor $k_i$ than the effect of the next lower valued binary output I–1 of the counter, k being a number between 1 and 2, subject to the equation $$k_1 = 2/(1+e_{imax}). \quad (1)$$

In this context, $e_{imax}$ designates an upper threshold of the relative error $e_i$ of the NBWE for the weighting factor $k_i$ of the binary output I. Hence, $$e_{imax} > e_i. \quad (2)$$

In the present description the relative error $e_i$ occurring in the weighting has not been considered. Only the nominal value has been defined for the weighting. The real weighting factor $w_i = k_i \cdot (1+e_i)$ of this output thus certainly is lower than 2, since $e_{imax}$ is greater than $e_i$. In this manner the positive steps in the characteristic transfer curve of the NBWE are kept smaller than the weighting unit (LSB unit) corresponding to the least significant bit (LSB) of the counter.

A conventional digital-to-analog-converter (DAC) differs significantly from the NBWE described here for adjusting parameters of an amplifier. In a DAC the characteristic of small steps between analog values of adjacent digital values is ensured by a low dynamic non-linearity (DNL) of <0.5 LSB units. In the NBWE, this characteristic can only be achieved for positive steps by the mentioned non-binary nominal weighting $k_i = 2/(1+e_{imax})$ of the outputs relative to each other. Hence, the NBWE can tolerate significantly greater errors of the internal structural components than would be required for a DNL of <0.5 LSB units. The intentional weighting with a real value of $w_i < 2$ at increasing count values thus generates in the NBWE negative steps in the characteristic transfer curve whose magnitude is much larger than a LSB unit. This constitutes a significant difference with respect to a DAC, since in a DAC no distinction is made between positive and negative steps of the non-linearity. In other words: A DAC converts a digital value as linearly as possible into an analog value; the described NBWE provides for an intentionally defined non-linearity of negative steps between adjacent values so that positive steps remain very small—below 1 LSB unit. FIG. 4 depicts an example of an ideal characteristic curve 401 of a DAC as well as an example of an ideal characteristic transfer curve 402 of a NBWE. In this manner, even large errors in the weighting factors can be tolerated, and a desired value can be very closely achieved.

As used in the context of the present invention, the described NBWE and a binary counter are utilized such that the digital value is changed until the desired analog value has been reached. In this connection, the digital value which will yield the desired analog value is of no importance. For instance, with a simple up-counter negative steps in the characteristic transfer curve can be tolerated since at the occurrence of such a step the count is continued until the next appropriate binary value has been reached.

This reduces the demands in respect of the characteristic curve to be reached. Instead of general monotony within a narrow tolerance range (small DNL's), the monotony is demanded incrementally only as is an overlap of the analog value ranges of the individual increments, for which it is sufficient if equation (1) is satisfied. The requirements in respect of the structural components of a NBWE are thus much lower than those of a DAC of comparable attainable precision.

The intentionally reduced non-binary weighting results in a overall lowering of the inclination of the characteristic curve, and a greater range of digital values is required in order with the described NBWE to cover the same range of analog values of the same resolution as a DAC. In the example of FIG. 4 the digital range would have to be about twice as large. This would require a counter which is larger by two bits and two more weighting steps of the NBWE than in a DAC. However, the additional space requirements for this purpose are much lower than the requirements of high-precision weighted steps in connection with a DAC.

This circumstance also contributes to more relaxed requirements in respect of the NBWE than those of a DAC and, therefore, to smaller chip surfaces.

In accordance with this solution, economical amplifiers may be structured for precise adjustments or self-adjustments, which has hitherto not been possible because of the high cost of DAC's.

In addition to its favorable costs, such an adjustment is advantageous because very small transistors may be used in the signal path of the amplifier, as, for instance, in the differential input stage. Possible errors as a result of the greater scattering of the smaller transistors, such as, for instance, high offset, may be compensated by the adjustment. As a result of the smaller transistors in the signal path the input capacitance may be much lower. Thus, advantages may be derived from the lower capacitances in the signal path. Among these are a higher cutoff frequency and lower energy consumption while at the same time the adjustment of offset or amplification remains stable over a long period. This is of great advantage for instance where the inputs of many amplifiers are switched to the same point.

In an advantageous embodiment the nominal non-binary weighting in the NBWE is established by a plurality of current mirrors in the NBWE. In this manner each weighting step can refer to the preceding step so that the nominal non-binary weighting is the simple result of interlinking. In this manner, the condition of equation (1) is easily satisfied, If, by contrast, the weighting, instead of being built upon an adjacent step, is built on each step individually, narrower tolerances for the errors of the individual steps would apply to satisfy equation (1). Current mirrors which are sufficiently precise for the described NBWE can be fabricated with very small transistors. Hence, the NBWE may be realized on a small surface.

In a further advantageous embodiment the nominal non-binary weighting is attained in the NBWE by the NBWE containing a resistance network structured as an R–2R network, but which is designed such that nominally, for resistors of value R it has resistors of value $X_i \cdot R$ for weighting step i, and for resistors of value 2R, the resistance value for weighting step i is $Y_i \cdot R$. In this configuration, the equation $$Y_i/X_i = 2/(k_i-1) \qquad (3)$$

applies to the quotient of $Y_i$ and $X_i$, $k_i$ being the nominal non-binary weighting of step i. Here, too, each weighting step may relate to the step preceding it so that the nominal non-binary weighting is the simple result of interlinking. This variant is of advantage where resistors of sufficient precision are technologically available and the relative error between them as a result of temperature drift is smaller than in an arrangement in which transistors are the weighting elements. A simplified case results where for all weighting steps $k_i$ is selected to be the same ($k_i=k$), so that every $Y_i=Y$ and every $X_1=X$ may also be identical.

In a further advantageous embodiment the resistance network is designed such that the values for $X_i$ and $Y_i$ for all weighting steps are always the same and are whole numbers, for instance X=2 and Y=5 for a nominal non-binary weighting of $k_i$=1.8. This makes it possible to construct the resistance network from standard resistors of nominal value R so that technological scattering can be reduced.

In a further advantageous embodiment the binary counter connected to the NBWE is a unidirectional counter. In this manner the complexity of digital circuitry for the digitally adjustable amplifier may be reduced.

In a further advantageous embodiment of the invention the counter connected to the NBWE is a bidirectional counter. By an insignificant extent of added digital circuitry for the digitally adjustable amplifier it would be possible incrementally to vary the parameter in both directions. This would enable rapid tracking of changes in the parameters, for instance.

In a further advantageous embodiment of the invention an amplifier with zero-point correction includes an inventive digitally adjustable amplifier. This would allow zero-point correction of high precision without generating interference as a result of frequent repetition of the adjustment. The complexity in terms of technology and chip surfaces would, however, be insignificant. At insignificantly increased technology or chip surface, amplifiers of insignificant zero error and without interference in the useful signal as a result of adjustments may thus be fabricated at a price significantly lower than heretofore possible.

In a further advantageous embodiment in accordance with the invention an amplifier the input offset voltage of which has been adjusted to a non-zero target value is provided with an inventive digitally adjustable amplifier. This would make it possible with great certainty but low requirements in terms of technology and chip surface to adjust the input offset voltage to a predetermined value without generating interference as a result of frequent adjustments. Such amplifiers with a defined input offset voltage may advantageously be used, for instance, as comparators with a defined switching threshold. As a result of its low surface requirements an analog-to-digital converter (ADC) may be equipped with such comparators in a single step or multi-step process so that even at a high conversion rate high precision is nevertheless possible.

In a further advantageous embodiment in accordance with the invention a digitally adjustable amplifier includes a pulse generator the pulse output of which is connected to the pulse input of the binary counter which controls the NBWE. Thus the pulse generator may be used in common for a plurality of inventive amplifiers. This is of particular advantage in respect of multiple inventive amplifiers provided on one chip. Moreover, it makes possible exterior control of the speed and instant of an adjustment.

In a further advantageous embodiment of the invention the balancing of the digitally adjustable amplifier is activated once for an uninterrupted energizing period, for instance when turning the amplifier on. Since after a single balancing phase for the uninterrupted energizing period no further adjustment takes place, such an amplifier may be connected and operated in the manner of a conventional non-adjustable amplifier. In that manner, fabrication-based errors may be avoided by adjustment without further affecting the manner of operation. This is similar to the behavior of an amplifier which has been balanced during its fabrication; but it is more economical and potentially more precise.

In a further advantageous embodiment in accordance with the invention the balancing of the inventive digitally adjustable amplifier is activated several times for an uninterrupted energizing period, for instance, in dependence of a timing pulse or of a circuit monitoring changes of temperature. Such an amplifier may be operated over extended periods in the manner of a conventional amplifier which cannot be adjusted and may repeat the adjustment at suitable intervals such as, for instance, during operating pauses. Seen over an extended period, many applications are discontinuous at any rate as, for instance, in the processing of data packages. In addition to adjustments for fabrication and age-based errors, such an amplifier may compensate errors changing over short periods. This makes increased precision possible. If in this process the amplifier is zero corrected, it substantially corresponds to the behavior of a conventional amplifier with auto-zero-process, however, without the interference from the operating frequency of the auto-zero process which often is in the kilohertz range. The compensation may instead be carried out at much greater intervals, as, for instance, during operating pauses. This combines the advantages of a conventional amplifier without adjustment with those of a conventional auto-zero mode amplifier, but nevertheless requires a small chip surface.

In a further advantageous embodiment of the invention the delay of a circuit with an adjustable delay may be adjusted by utilizing the effect of the input offset voltage or-of the amplification of an inventive digitally adjustable amplifier on the delay. In this manner, a delay element of long-time stability can be fabricated which can be balanced with great precision.

In a further advantageous embodiment of the invention the filtering characteristic of a circuit may be adjusted by utilizing the effect of the input offset voltage or of the amplification of an inventive digitally adjustable amplifier on the filtering property. In this manner, a filter of long-time stability may be fabricated which can be adjusted with great precision.

In a further advantageous embodiment of the invention the frequency of an adjustable oscillator may be adjusted by utilizing the effect of the input offset voltage or of the amplification of an inventive digitally adjustable amplifier on the frequency. In this manner an oscillator of long-time stability may be manufactured which can be adjusted with great precision.

In a further advantageous embodiment of the invention an ADC contains amplifiers or circuits of the kind referred to supra, such as, for instance, comparators with a switching threshold defined by adjustment. In this manner the accuracy or speed of an ADC may be increased and the required surface may be reduced. The adjustment makes possible significantly smaller transistors at the input which results in a reduction of the input capacitance of the ADC as a whole. This, in turn, simplifies its energization. With little technological effort, it makes possible very fast and, at the same time, precise ADC's, for instance as flash ADC's or multistep ADC's.

DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:—;

DETAILED DESCRIPTION OF PREFERRED EMBODIMENTS

First Embodiment

Figure 1:
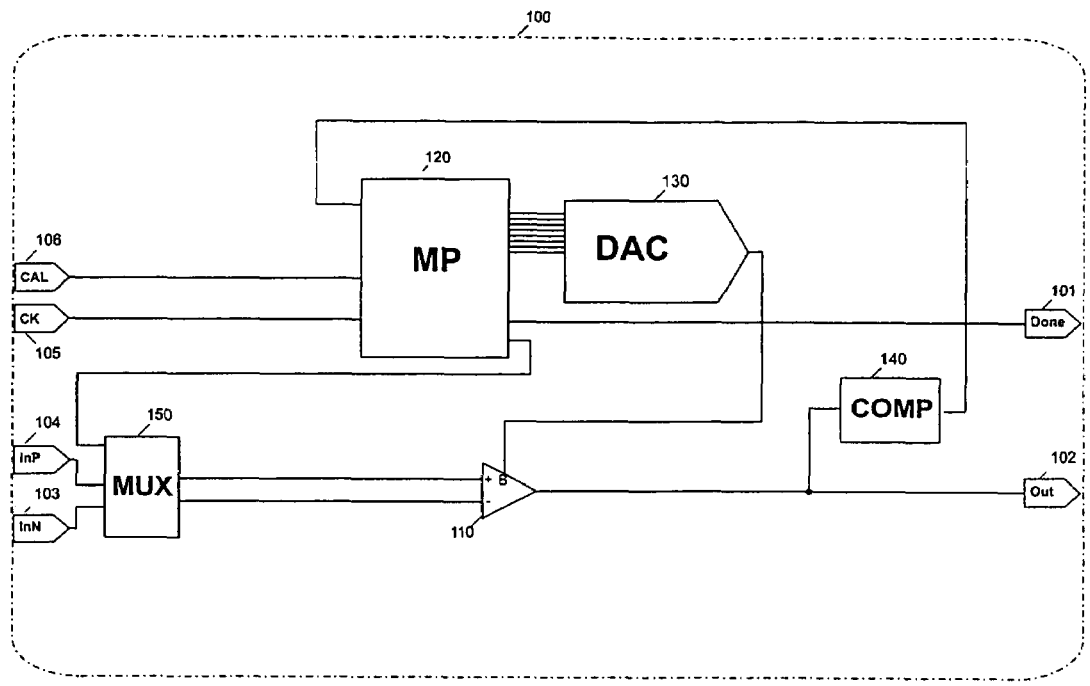
FIG. 1 is a circuit block diagram of a conventional digitally adjustable amplifier provided with a microprocessor (MP) and digital-to-analog-converter for a long-time adjustment of the zero point.
Figure 2:
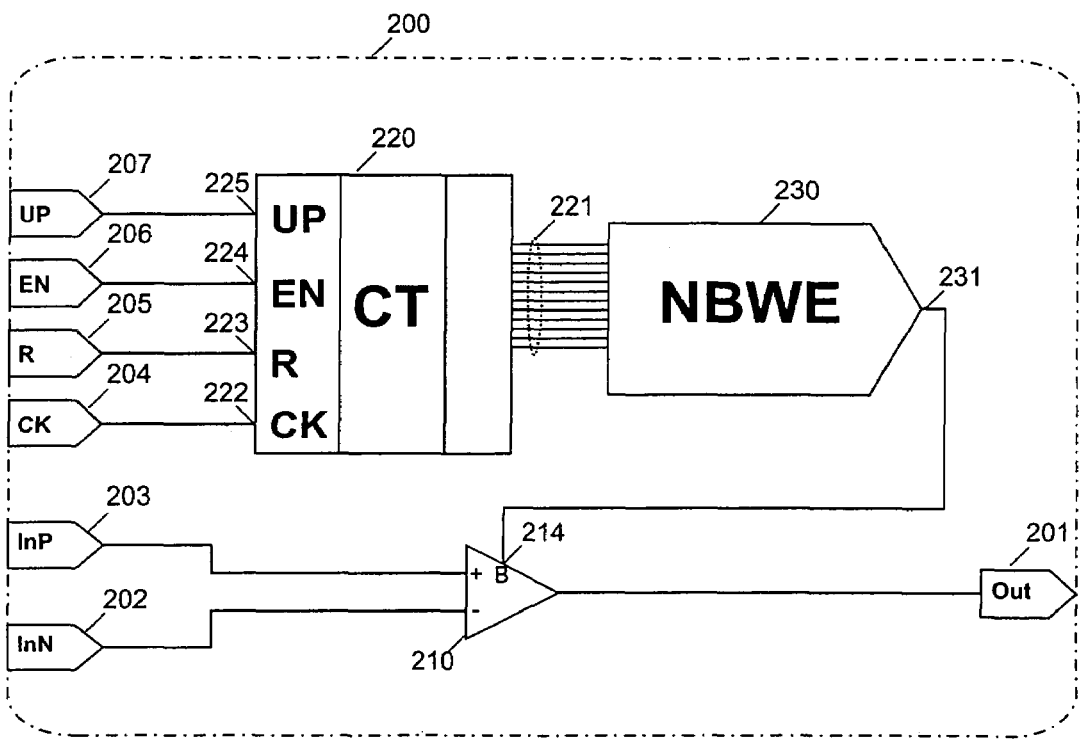
FIG. 2 is a circuit block diagram of a universal variant of an inventive digitally adjustable amplifier for the long-time adjustment of parameters, including counter (CT) and non-binary weighting element (NBWE)

FIG. 2 depicts a circuit block diagram of a universal variant of a digitally adjustable amplifier 200 in accordance with the invention for the long-time stable adjustment of parameters with a binary counter 220, non-binary weighting element (NBWE) 230 and adjustable analog amplifier 210 having an input 214 for setting the input offset voltage or the amplification in a manner to be described. The counter 220 is provided with B binary outputs 221 which are numbered 1 to B in ascending priority. The counter 220 in the example of FIG. 2 is provided with further inputs for the clock pulse (CK) 222, reset (R) 223, release of the counter (EN) 224 and for switching the direction of the count (UP) 225. These inputs are also inputs 204–207 of the digitally adjustable amplifier 200 in accordance with the invention. By switching these inputs the digitally adjustable amplifier 200 may be adjusted to requirements of specific applications. The B binary outputs 221 of the counter 220 are connected to the NBWE 230. The purpose of the counter 220 is to energize the NBWE as well as to store a binary adjustment value. The outputs of the counter 220 are effective in the sequence of the binary priority weighted to the analog value at the output 231 of the NBWE 230, the weighting itself not being 2 but less than 2 and more than 1.

Without considering errors in the weighting of the NBWE 230, the factor by which the weighting is increased when transitioning from one output of the counter 220 to the next higher output i of the counter 220 is the nominal weighting factor $k_i$ of any given output i.

In the actual NBWE 230 each of these weightings has a relative error designated $e_i$ for the weighting factor $k_i$ of the binary output i. The actual weighting factor $w_1$ of the binary output i is thus $w_i = k_i \cdot (1+e_i)$. $e_{imax}$ designates an upper threshold of the relative error $e_i$.

In the present embodiment the NBWE 230 is additionally to be assumed to be dimensioned such that regardless of errors all weighting factors are identical, i.e. $k_i = k$ for all i. The factor k is to be selected to be sufficiently small so that an upper threshold $e_{imax}$ can be found with $e_{imax} > e_i$ which holds true for equation (1). At a maximum value of, for example, 10% for the relative error $e_i$, a value of k=1.8 is sufficiently small, for based on the equation $k=2/(1+e_{1max})$ the resultant value derived from k for $e_{imax}=11.11\%$ which also satisfies $e_{imax} > e_i$, so that $e_{imax}$ constitutes an upper threshold for $e_i$. The actual weighting factor $w_i$ then lies in the interval between 1.62 to 1.98.

Figure 4:
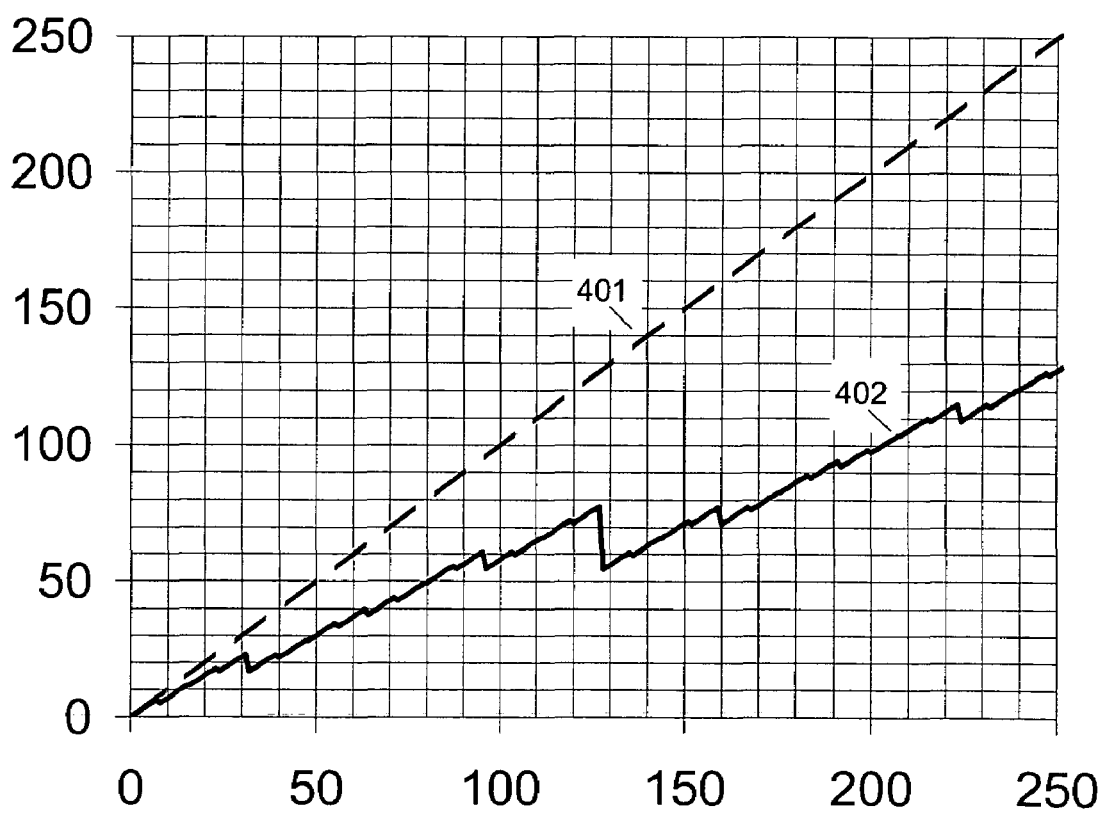
FIG. 4 are examples of ideal characteristic transfer curves of a DAC and of a NBWE.

The connection between the binary value of the counter 220 and the analog value at the output 231 of the NBWE 230 thus approximately corresponds qualitatively to the non-linear characteristic curve 402 in FIG. 4 if the initial analog value is suitably normalized. The non-linear characteristic curve 402 at increasing count value intentionally has larger negative steps which result from the value of $w_i < 2$. $w_i < 2$ ensures that positive steps remain smaller than a smallest weighting unit which corresponds to least significant bit (LSB) of the counter. In this manner it is possible to find, in the range of possible initial values for the NBWE 230, for each desired analog target value a neighboring initial value of the NBWE 230 which is removed by less than half the least significant bit from the target value. It is thus possible to adjust the input offset voltage or amplification parameters with sufficient accuracy.

In an application in accordance with the invention the NBWE 230 and the counter 230 are utilized such that the digital value is changed by counting until the desired value of the input offset or amplification parameter has been reached by way of the change of the analog value at the control input 214 of the adjustable analog amplifier 210. By activating its input UP 210 the counter can be configured, for instance, as an up counter, and negative steps in the characteristic transfer curve can be tolerated by continuing the counting up to the next suitable value in case such a step occurs. When the value has been reached, counting may be discontinued, for instance by way of the release input EN 206. The speed of the upward count is determined by the clock rate at the input CK 204 and may thus be adjusted to the processing speed of the connected structural components, for instance of a comparator at the output Out 201. The smaller k is selected, the larger may be the errors $e_i$ of the segments of the NBWE 230 which can be tolerated. But the increase of the characteristic curve of the NBWE 230 is reduced so that at a smaller value for k, slightly more binary outputs of the counter 220 are required in order to cover the same range of analog values at the output of the NBWE 230.

For instance, with the maximum value of the relative error $e_i$ of 10% a precision of only about 3 bit can be attained in a conventional DAC, since the precision of the adjustment at best equals the precision of the highest order weighting step. An adjustment with a DAC to a precision of 16 bit, for instance, would require a maximum value for the relative error $e_1$ of less than 0.002%. integrated structural components of such a narrow tolerance are difficult to fabricate and as a rule they would require regular adjustments. If, however, an amplifier in accordance with the invention is adjusted by way of a counter 220 and a NBWE 230, a maximum value for the relative error $e_i$ of 10%, for instance, would not constitute an obstacle to attaining the possible precision. With the mentioned value of k=1.8, only 3 more binary outputs of the counter 220, i.e. a total count of 19 bit, would be required for an adjustment of a 16 bit precision.

A binary counter of 19 bit and a NBWE of 19 steps with a 10% permissible error of the structural elements may easily be fabricated on a small chip surface, compared to the space required for a 16 bit DAC. The power loss of the device in accordance with the invention is also substantially lower since its circuit may be simpler.

The example depicted in FIG. 2 of an amplifier according to the invention digitally adjustable with great precision includes the adjustable analog amplifier and the adjustment device for generating and storing the adjustment value. By adding further structural groups, such as a comparator, the universally adjustable amplifier may be improved with conventional technical means into an adjustable amplifier for specific applications, such as an amplifier with zero point correction or for adjusting the amplification.

Second Embodiment

This embodiment is an improvement of the first embodiment. The non-binary weighting element (NBWE) 230 of the digitally adjustable amplifier 200 in accordance with the invention of FIG. 2 may in an advantageous structure contain a chain of current mirrors.

For purposes of explanation, the NBWE 230, as in the previous embodiment may be assumed to be dimensioned such that without considering errors, all weighting factors $k_i$ are identical, i.e. $k_i$=k for all i, and the factor k is assumed to be 1.8 for a maximum value of the relative error $e_i$ of 10%, for instance. The weighting of the steps in the NBWE 20 may be carried out from the lowest to the highest value or vice versa. In case of the latter, a reference current $I_{ref}$ is initially reflected into two identical currents of value $I_{ref}$ by a current reflector provided with identical transistors. Under the control of the highest order output B of the binary counter 220 one of these two output currents $I_{ref}$ is switched to the output of the NBWE 230 where for the conversion of current to voltage an output resistor $R_{out}$ generates therefrom a voltage $(Z_B \cdot I_{ref} \cdot R_{out})$, $Z_B$ representing the binary value 0 or 1 at output B. The second of the two output currents $I_{ref}$ is reflected by a further current mirror with differently weighted transistors into two identical currents $I_{ref}/k$, i.e. $I_{ref}/1.8$. Under the control of the next lower ordered output B−1 of the binary counter 220 one of the two $I_{ref}/k$ output currents is also switched to output resistor $R_{out}$ at the output of the NBWE 230 which thus results in a voltage $(Z_{B-1} \cdot (I_{ref}/k) \cdot R_{out})$, $Z_{B-1}$ being the binary value 0 or 1 at the output B−1. This process is continued at the following steps: the second of the two $I_{ref}/k$ output currents is reflected by a further current mirror with differently weighted transistors into two identical currents $I_{ref} k \cdot k$, i.e. $I_{ref}/3.61$, and so on to the smallest current $I_{ref}/k^{B-1}$, i.e. approximately $I_{ref}/39346$ for a 19-step counter 220 of k=1.8. Since each weighting step refers to its predecessor step, the resultant nominal non-binary weighting is, by simple interlinking, k, e.g. k=1.8, with each of the current mirrors scaling the current by k may have a 10% error, so that for this purpose very small transistors of low fabrication precision are sufficient.

Third Embodiment

This embodiment is also an improvement of embodiment 1. The non-binary weighting element (NBWE) 230 of the invented digitally adjustable amplifier 200 of FIG. 2 may in an advantageous structure contain a resistance network structured as an R–2R-network, but which is designed such that nominally, for resistors of value R, it contains resistors of value $X_i \cdot R$, and for resistors of value $Y_i$ it has resistors of value $Y_i \cdot R$. As in the embodiment of FIG. 2, the NBWE 230 is again assumed to be dimensioned such that without regard to errors, all weighting factors $k_i$ equal k which equals 1.8. Furthermore, in this embodiment $X_i$=X=1. Based upon equation (3) the result of $Y_i$=Y is then 2.5. This "R–2.5R network" is used in the manner of a conventional R–2R network for weighting the binary outputs of the counter 220; however, because of the value 2.5 instead of 2, the resultant weighting is non-binary. Here, too, the least significant weighting value generated is, for example, about 1/39346 of the highest value for a 19-step counter 220 of k=1.8. Compared to the prior embodiment, this variant may be of advantage because resistors can exhibit a more constant behavior than transistors, for instance, relative to temperature changes.

Fourth Embodiment

This embodiment is an improvement of the third embodiment. The XR-YR network is designed such that the values for X and Y are whole numbers. Where, for instance, X=2 and Y=5 for a non-binary weighting of $k_i$=1.8 there would be formed a "2R-5Y network" instead of an "R–2.5R network". In this manner the resistance network can be formed of standard resistors of nominal value R so that technological scattering is reduced.

Fifth Embodiment

Figure 3:
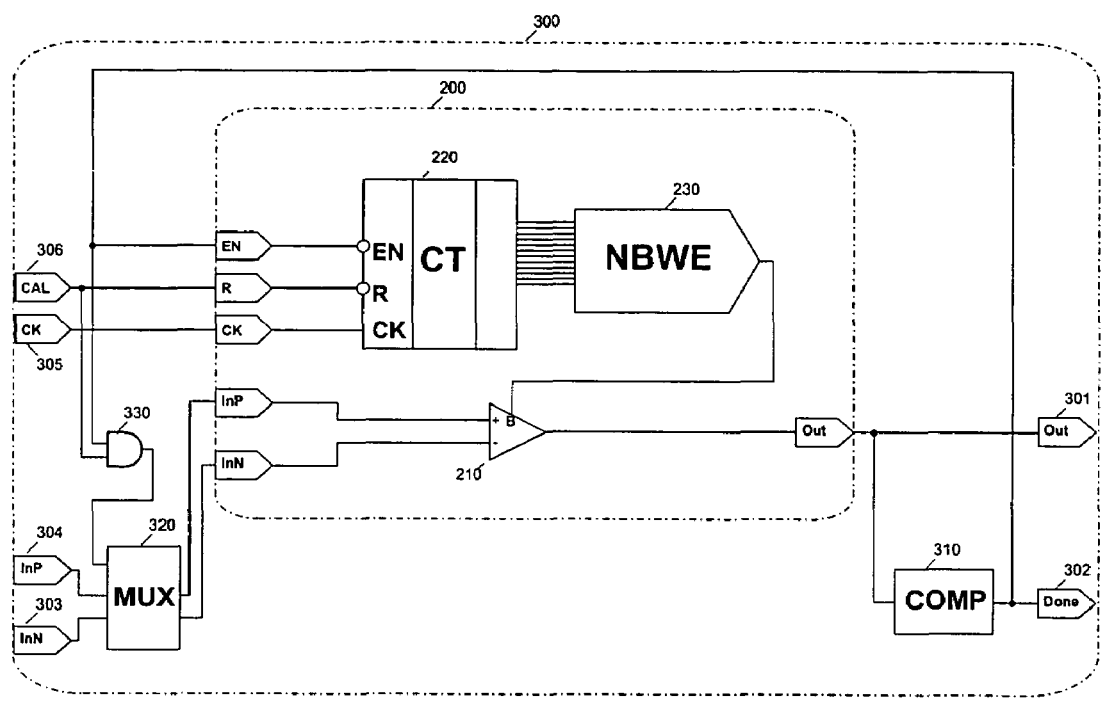
FIG. 3 is a circuit block diagram of a variant of an inventive self-adjusting amplifier with a unidirectional counter for the long-time adjustment of zero.

FIG. 3 is a block diagram of a variant of a self-adjusting amplifier 300 for a long-time stable adjustment of zero. It includes an inventive digitally adjustable amplifier 200 with a binary counter 220, non-binary weighting element (NBWE) 230 and adjustable analog amplifier 210. Furthermore, it includes a comparator (COMP) 310, an input switch (MUX) 320 and an AND-gate 330. The binary counter 220 connected to the NBWE 230 is a unidirectional counter 220 provided with inputs for the clock pulses (CK), for resetting (R) and for releasing (EN) the counter, the latter two being active at a logic 0. The inputs for the clock pulses (OK) and for resetting (R) are also inputs 305, 306 of the self-adjusting amplifier 300, the input for resetting R of the counter 220 being used as an input (CAL) 306 for activation of the adjustment of the self-adjusting amplifier 300. The output of the comparator 310 is connected to the switching input of the input switch 320. At the same time, it serves as output (DONE) 302 for signalling completion of the adjustment of the self-adjusting amplifier 300.

Upon activation of the input 306 for activating the adjustment by briefly applying a logic 0, the input switch 320 is switched so that the two inputs of the adjustable analog amplifier 210, instead of being further connected to the inputs 303, 304 of the self-adjusting amplifier 300, switch to zero voltage. In case the zero point is not to be adjusted to zero but, instead, to a predetermined voltage which is not zero, the two inputs of the adjustable analog amplifier 210 will be switched by the input switch 320 such that this voltage is applied between them. In addition, the counter 220, which in this embodiment is an up-counter, is reset to zero. When the counter 220 is reset all binary values will transition to 0, so that the minimum initial value will be formed at the output of the NBWE 230. The minimum value is effective by way of the input of the adjustable analog amplifier 210 to form a minimum value at the output thereof also which is below the switching threshold of the comparator 310. Thus, the binary output signal of the comparator 310 is 0. If, for activating the adjustment, the input 306 becomes inactive again, resetting of the counter 220 is terminated, and the binary counts increases with each pulse at the input 305 of the self-adjusting amplifier 300. This also causes the output value of the NBWE 230 to increase, even though in part with negative steps in accordance with the non-linear characteristic curve, such as curve 402 of FIG. 4, and the output value of the adjustable analog amplifier 210 in principle also increases while it drops temporarily. After a number of pulse counts the switching threshold of the comparator 310 will be reached. Since the positive steps of the non-linear characteristic curve all are of the maximum value of a LSB unit, the output value of the NBWE 230 is removed from the ideal adjustment value by no more than one LSB unit. A maximum zero error of 1 µV, for instance, can be attained without any problems by a sufficient number of steps of the counter 220 and of the NBWE 230. At this instance, the output of the comparator 310 transitions to 1 so that the counter 230 counts no further, and the signal indicating completion of the adjustment is issued at the output 302. At the same time, the input switch 320 is switched again so that the adjustable analog amplifier 210 between the inputs and outputs of the self-adjusting amplifier 300 operates as it did before the adjustment, but with a precisely adjusted zero point which is maintained stable by the value in the register of the counter 220. All structural groups used in addition to the adjustable analog amplifier 210 for this adjustment either pose low demands in terms of precision, such as the steps of the NBWE 230 of 10% error tolerance for instance, or they are digital circuits which may be fabricated in a simple manner on a very small chip surface. The comparator 310 may be a very simple comparator, for instance, two inverter stages or simply form, at sufficient amplification and an appropriate range of output voltage of the adjustable analog amplifier 210, a connection between input and output, and may be unnecessary as an active circuit.

If, in addition to what is shown in FIG. 3, the input 306, for activation of the adjustment, is provided with a monitoring circuit for the operating voltage, the adjustment is activated once for an uninterrupted energization period. This would roughly correspond to the behavior of an amplifier which has been adjusted during fabrication (for instance by trimming with a laser), but is significantly more economical and, in addition, more precise, since aging may be compensated between energization phases.

If, in this connection, the self-adjusting amplifier 300 is additionally provided with a pulse generator which is connected to the input 305 for the pulse count, an amplifier is formed which adjusts itself when it is being energized, which may be fabricated as completely compatible with an amplifier without internal adjustment. In that case the output for signalling completion of the adjustment may be dispensed with.

If, on the other hand, the input 306 is repeatedly activated for activating the adjustment during operation of the circuit, as during uncritical phases during processing of data packages, errors changeable at short intervals such as changes with temperature and very low frequency noise may be compensated also.

By the present embodiment an adjustable analog amplifier 210 can be upgraded with little effort to a high-grade amplifier for precisely adjusting the zero point. By comparison with conventional solutions with volatile storage, the adjustment value is securely stored in the counter 220 so that no interfering frequencies are generated as a result of adjustments at high repetition rates. Compared to conventional solutions involving DAC's much less chip surface is required, and the power losses are lower. This solution makes it possible to apply amplifiers of stable precise adjustment even where chip surfaces, costs or interference frequencies have heretofore prevented such use.

For instance, the comparators in an ADC can be equipped by single step processes (flash ADC) or multi-step processes (multistep ADC) to form very fast and, at the same time, precise ADC's, with little effort.

What is claimed is:

1. A digitally adjustable amplifier with adjustable input offset voltage and amplification parameters for use in integrated circuits, comprising:
   an adjustable analog amplifier comprising an input for adjusting at least one of the input offset voltage and amplification thereof;
   a block having B binary inputs and an analog output connected to the input;
   a binary counter comprising B binary outputs of predetermined value i;
   a weighting element for providing a weighting factor $k_i$ for each value i of the binary outputs from 1 to B, the weighting factor $k_i$ having an inherent relative error $e_i$ with an upper threshold $e_{imax}$ for defining the weighting factor as $k_i=2/(1+e_{imax})$; and
   means for connecting the B binary inputs to the B binary outputs.

2. The amplifier of claim 1, wherein the block is provided with current mirrors.

3. The amplifier of claim 1, wherein the block is provided with a resistance network structured as a R-2R-network, wherein for each value i a resistor valued R is substituted by a resistor valued $X_i \cdot R$ and the resistor valued 2R is substituted by a resistor valued $Y_i \cdot R$, the quotient of $Y_i$ and $X_i$ being defined as $Y_i/X_i=2/(k_i-1)$.

4. The amplifier of claim 3, wherein the values for $X_i$ and $Y_i$ for all weighting steps are identical and are whole numbers $X_i=X=2$ and $Y_i=Y=5$ ("2R-5R-network"), the resistance network being built of standard resistors of nominal value R.

5. The amplifier of claim 1, wherein the binary counter is a unidirectional counter.

6. The amplifier of claim 1, wherein the binary counter is a bidirectional counter.

7. The amplifier of claim 1, wherein the binary counter comprises a clock input.

8. The amplifier of claim 7, further comprising a pulse generator connected to the clock input.

9. The amplifier of claim 7, further comprising an external clock input connected to the clock input of the binary counter.

10. The amplifier of claim 1, wherein the adjustment is activated at least once for a given uninterrupted energizing period.

11. The amplifier of claim 7, further comprising means for monitoring temperature changes and wherein the adjustment is activated at least once in response to at least one of a clock pulse and signal from the monitoring means.

* * * * *